United States Patent
Roizin et al.

(10) Patent No.: US 7,795,087 B2
(45) Date of Patent: Sep. 14, 2010

(54) ULTRA-VIOLET PROTECTED TAMPER RESISTANT EMBEDDED EEPROM

(75) Inventors: Yakov Roizin, Migdal Haemek (IL); Yossi Netzer, Migdal Haemek (IL); Ira Naot, Migdal Haemek (IL); Myriam Buchbinder, Migdal Haemek (IL); Avi Ben-Guigui, Migdal Haemek (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 12/207,542

(22) Filed: Sep. 10, 2008

(65) Prior Publication Data

US 2009/0011576 A1    Jan. 8, 2009

Related U.S. Application Data

(60) Division of application No. 11/338,418, filed on Jan. 23, 2006, which is a continuation-in-part of application No. 11/065,312, filed on Feb. 23, 2005, now Pat. No. 7,439,575, which is a division of application No. 10/659,031, filed on Sep. 9, 2003, now Pat. No. 6,959,920.

(51) Int. Cl.
*H01L 21/8239* (2006.01)

(52) U.S. Cl. .............. 438/211; 438/157; 438/283; 438/596

(58) Field of Classification Search .............. 438/157, 438/176, 795, 211, 283, 593, 596
See application file for complete search history.

(56) References Cited

U.S. PATENT DOCUMENTS

| | | | |
|---|---|---|---|
| 3,743,847 A | 7/1973 | Boland | |
| 5,051,793 A * | 9/1991 | Wang | 257/316 |
| 5,168,334 A | 12/1992 | Mitchell et al. | |
| 5,825,059 A | 10/1998 | Kuroda | |
| 6,081,456 A | 6/2000 | Dadashev | |
| 6,181,597 B1 | 1/2001 | Nachumovsky | |

(Continued)

FOREIGN PATENT DOCUMENTS

JP    2001-284563    12/2001

OTHER PUBLICATIONS

C.K. Barlingay et al. "Mechanism of Charge Induced Plasma Damage to EPROM Cells During Fabrication of Integrated Circuits", 7th Int'l. Symposium on Plasma- and Process-Induced Damage, Jun. 2002, Hawaii, 4 pages.

(Continued)

*Primary Examiner*—David Vu
*Assistant Examiner*—Earl N Taylor
(74) *Attorney, Agent, or Firm*—Bever, Hoffman & Harms, LLP; E. Eric Hoffman

(57) ABSTRACT

A pre-metal dielectric structure of a single-poly EEPROM structure includes a UV light-absorbing film, which prevents the charge on a floating gate of the EEPROM structure from being changed in response to UV radiation. In one embodiment, the pre-metal dielectric structure includes a first pre-metal dielectric layer, an amorphous silicon layer located over the first pre-metal dielectric layer, and a second pre-metal dielectric layer located over the amorphous silicon layer.

16 Claims, 19 Drawing Sheets

U.S. PATENT DOCUMENTS

| | | |
|---|---|---|
| 6,256,231 B1 | 7/2001 | Lavil |
| 6,410,210 B1 | 6/2002 | Gabriel |
| 6,440,797 B1 | 8/2002 | Wu et al. |
| 6,680,509 B1 | 1/2004 | Wu et al. |
| 6,765,254 B1 | 7/2004 | Hui et al. |
| 6,774,432 B1 | 8/2004 | Ngo et al. |
| 2004/0046215 A1 | 3/2004 | Hasunuma et al. |

OTHER PUBLICATIONS

S. Song et al. "Avoiding Plasma Induced Damage To Gate Oxide With Conductive Top Film (CTF) on PECVD Contact Etch Stop Layer", 2002 Symposium On VLSI Technology Digest of Technical Papers, pp. 72-73.

* cited by examiner

ULTRA-VIOLET PROTECTED TAMPER RESISTANT EMBEDDED EEPROM

RELATED APPLICATIONS

This application is a divisional of U.S. patent application Ser. No. 11/338,418 entitled "Ultra-Violet Protected Tamper Resistant Embedded EEPROM" filed Jan. 23, 2006, which is a continuation-in-part of U.S. patent application Ser. No. 11/065,312 entitled "Protection Against In-Process Charging In Silicon-Oxide-Nitride-Oxide-Silicon (SONOS) Memories" filed Feb. 23, 2005, which is a divisional of U.S. patent application Ser. No. 10/659,031 entitled "Protection Against In-Process Charging In Silicon-Oxide-Nitride-Oxide-Silicon (SONOS) Memories" filed Sep. 9, 2003, now issued as U.S. Pat. No. 6,959,920.

FIELD OF THE INVENTION

The present invention relates to a method for decreasing the influence of external UV light on a floating gate electrode in a semiconductor device which uses this electrode for storing information as electrical charges.

RELATED ART

Non-volatile memory (NVM) cells, such as electrically erasable programmable read only memory (EEPROM) cells, which store charge in polycrystalline silicon (polysilicon) floating gate structures are susceptible to ultra-violet (UV) radiation having quanta energy greater than 3.2 electron-Volts (eV). More specifically, because the potential barrier for electrons at a silicon oxide-silicon (SiO—Si) interface is 3.2 eV, UV radiation having a quanta energy greater than 3.2 eV can cause electrons to be removed from a polysilicon floating gate through a silicon oxide layer. UV irradiation can therefore undesirably cause the charge state of a polysilicon floating gate to change, such that information stored in the polysilicon floating gate is lost.

The back end layers of most EEPROM devices are at least partially transparent in the dangerous UV range. For example, many conventional back end layers (i.e., layers of a multi-layer interconnect structure) contain silicon oxide, silicon nitride and/or silicon oxynitride. Such layers are transparent to UV radiation. A patterned metal layer may be used to provide some UV protection. However, such protection will be limited, due to the relatively large distance between the patterned metal layer and the underlying polysilicon floating gate structures. This relatively large distance allows significant light penetration through gaps in the patterned metal layer. In addition, an additional mask must be added to the back end process flow in order to create the patterned metal layer. Moreover, the patterned metal layer undesirably introduces high parasitic capacitances to the interconnect structure.

EEPROM cells that are included in a package-less integrated circuit or a chip packaged in a UV transparent (or partially transparent) package can absorb significant amounts of UV radiation, even when exposed to natural sunlight. Such UV exposure may occur in radio frequency identification (RFID) or smart card products, where the EEPROM containing dice are directly attached to a transparent sticker or a plastic card. This situation is especially dangerous when products with RFID tags are stored close to strong UV sources (e.g., exposed to sunlight, or located near arc welding facilities or certain luminescent lamps).

A common tamper attack method, wherein illegal reading is performed from embedded EEPROM products, consists of local irradiation of EEPROM cells (typically from the front side) in combination with a varied (decreased) power supply voltage. This technique enables the programmed and erased bits of the EEPROM cells to be distinguished by simply controlling the chip functionality. In some cases, it is possible to change information stored by the embedded EEPROM products. It is especially critical to prevent the changing of information for smart cards, which may store personal and/or financial information. The UV tamper attack technique is non-invasive and can be applied to embedded EEPROM cells that do not have special tamper protecting designs. The UV tamper attack technique is especially effective for RFID chips that include EEPROM cells fabricated within a single polysilicon layer technology and having a large cell periphery (i.e., tens of microns).

A layer of organic polymer, such as polyimide, can be added over the top of the back end dielectric stack. This organic polymer layer is patterned to allow electrical contacts to the device bond pads. The organic polymer layer might have a composition that renders this layer not transparent to UV radiation. However, the formation and patterning of an organic polymer layer adds costly process steps, prevents scaling of the dimensions of the bond pad openings, and is non-standard in advanced sub-micron VLSI processes. Moreover, the organic polymer layer is easily removed in acid, without etching the pads, and thus fails to complicate tampering attacks.

It would therefore be desirable to have a tamper resistant system for a device that implements EEPROM cells fabricated with a single gate layer. It would further be desirable if the processes required to fabricate such a device were highly compatible with conventional fabrication processes (e.g., would not require the use of additional mask steps).

SUMMARY

Accordingly, the present invention provides an improved back end structure for a non-volatile memory cell that includes a polysilicon floating gate. The back end structure of the present invention is most beneficial when the non-volatile memory cell is fabricated using a single polysilicon layer.

In accordance with one embodiment, the back end structure includes a light absorbing layer, which prevents UV radiation from reaching the polysilicon floating gate. In a preferred embodiment, the light absorbing layer is included in a pre-metal dielectric layer located between the polysilicon floating gate and the first metal layer, thereby preventing the polysilicon floating gate from being electronically discharged in response to UV irradiation. In other embodiments, the light absorbing layer is included in an inter-metal dielectric layer. The requirements/desirable properties of the light-absorbing layer are as follows. First, the light-absorbing layer must efficiently block UV light. Second, the fabrication of the light-absorbing layer should be compatible with a core VLSI process. Third, the light-absorbing layer should only require minimum changes to the memory array parameters. For example, the light-absorbing layer should only introduce a minimum capacitive coupling to the memory array. Fourth, the light-absorbing layer should require a minimum number of additional masks. Fifth, the light-absorbing layer should be electrically non-conductive. In one embodiment, the light-absorbing layer is amorphous silicon.

In accordance with one embodiment, a non-volatile memory structure includes a semiconductor substrate, a plurality of polysilicon floating gates formed over the semiconductor substrate, and a plurality polysilicon control gates formed over the semiconductor substrate. In one embodiment, the floating gates and control gates are formed from the same polysilicon layer. A thin silicon nitride barrier layer is formed over the resulting structure, in accordance with conventional processing techniques. A first pre-metal dielectric layer is formed over the silicon nitride barrier layer. This first pre-metal dielectric layer can be, for example, USG or BPSG. The light-absorbing layer is then formed over the first pre-metal dielectric layer. A second pre-metal dielectric layer is then formed over the light-absorbing layer. The second pre-metal dielectric layer can be, for example, BPSG.

A photoresist mask, which defines the locations of the various contacts, is then formed over the second pre-metal dielectric layer. An etch is performed through the photoresist mask, thereby creating contact openings through the second pre-metal dielectric layer, the light-absorbing layer and the first pre-metal dielectric layer. This etch is stopped on the silicon nitride barrier layer.

In one embodiment an oxidation step is then performed, thereby creating an insulating oxide on the exposed sidewalls of the light-absorbing layer. In another embodiment, a chemical vapor deposition (CVD) dielectric layer is formed on the exposed sidewalls of the light-absorbing layer. In yet another embodiment, both the insulating oxide and the CVD dielectric layer are formed. The exposed portions of the silicon nitride barrier layer in the contact openings are then removed.

The contact openings are subsequently filled with a contact metal, such as tungsten or aluminum. In one embodiment, the contacts are isolated from the light-absorbing layer by the insulating oxide and/or the CVD dielectric layer formed on the exposed sidewalls of the light-absorbing layer. In another embodiment, the specific resistance of the light-absorbing layer (e.g., amorphous silicon) is high enough (e.g., greater than about $10^9$ Ohm/sq at maximum operation temperature) that no dielectric material is required on the exposed sidewalls of the light-absorbing layer.

The present invention will be more fully understood in view of the following description and drawings.

DETAILED DESCRIPTION

Figure 1:
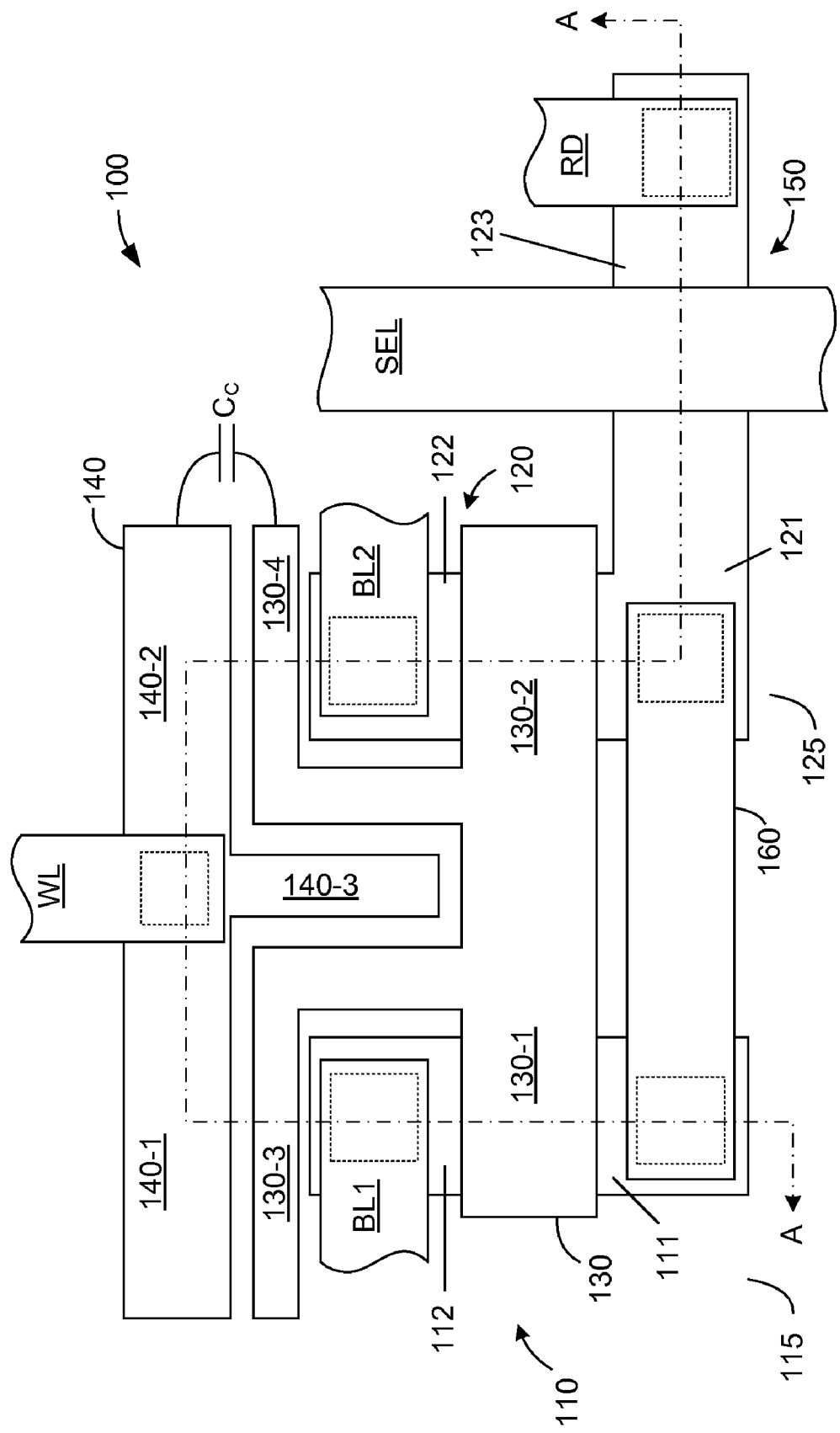
FIG. 1 is a top view of a single-poly NVM cell, which is used to illustrate one embodiment of the present invention.

FIG. 1 is a top view of a single-poly non-volatile memory (NVM) cell 100, which is used to illustrate one embodiment of the present invention. As used herein, a single-poly NVM cell includes any NVM cell fabricated with a single gate layer. This single gate layer can be used to form the control gate and floating gate of the NVM cell, as well as the control gate of any other transistor fabricated on the same wafer. In the described embodiments, single-poly NVM cell 1000 is an electrically programmable erasable read only memory (EEPROM) cell. EEPROM cell 100 includes a p-channel NVM transistor 110 formed in an n-well region 115, and an n-channel NVM transistor 120 and a select transistor 150 formed in a p-well region 125. In addition, a metal structure 160 is connected between drain regions of p-channel transistor 110 and n-channel transistor 120. A floating gate 130 and a control gate 140 of EEPROM cell 100 are fabricated using a single polysilicon layer and arranged in an inter-digitated manner. In particular, floating gate 130 includes a first floating gate portion 130-1 formed over a channel of p-channel transistor 110 and a second floating gate portion 130-2 formed over a channel of n-channel transistor 120. In addition, floating gate 130 includes a third portion 130-3 that extends from the first floating gate portion 130-1 and extends along a first portion 140-1 of control gate 140. Floating gate 130 also includes a fourth portion 130-4 that extends from second floating gate portion 130-2 and extends along a second portion 140-2 of control gate 140. Moreover, control gate 140 includes a finger (third) portion 140-3 that extends into a channel formed by third portion 130-3 and fourth portion 130-4. By varying the distance between these portions of floating gate 130 and control gate 140, a capacitive coupling Cc is established that facilitates operation of EEPROM cell 100.

Figure 2:
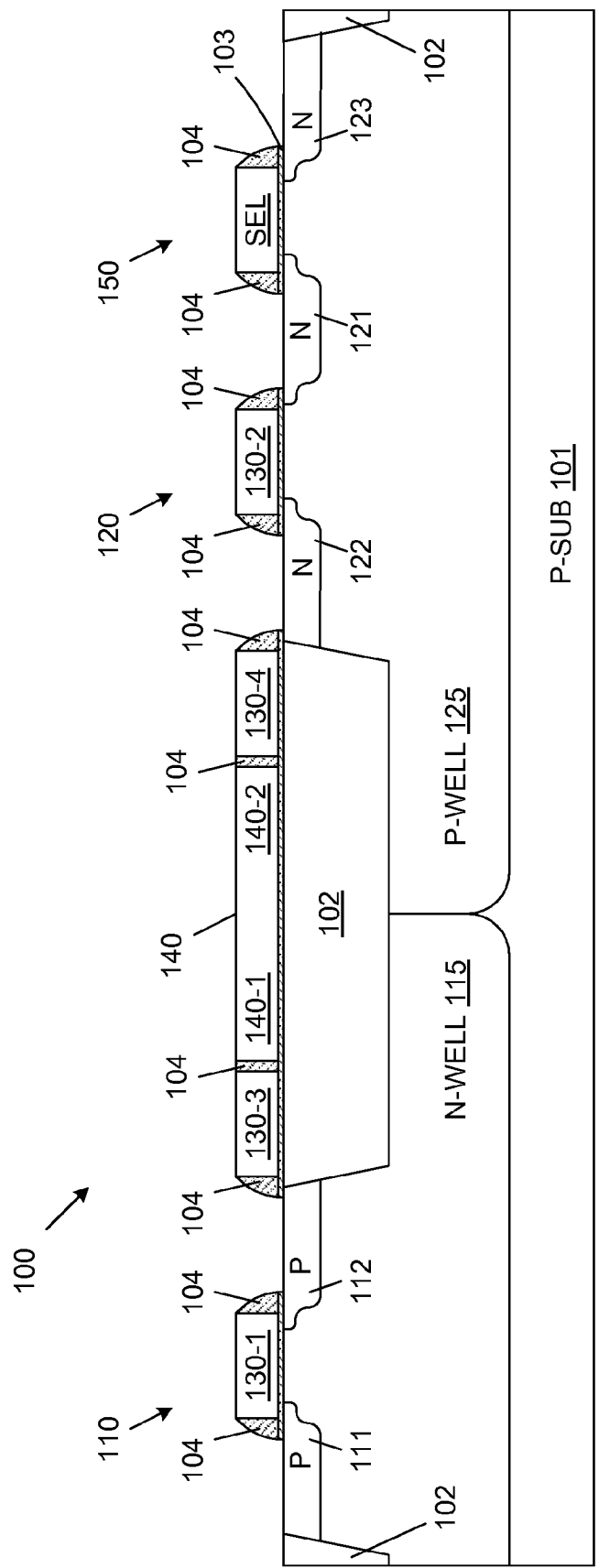
FIG. 2 is a cross sectional view along section line A-A of the single-poly NVM cell of FIG. 1.

FIG. 2 is a cross sectional view of EEPROM cell 100 along section line A-A of FIG. 1. Additional elements shown in FIG. 2 include monocrystalline silicon substrate 101, field dielectric region 102, gate dielectric layer 103 and dielectric sidewall material 104. The operation and design of EEPROM cell 100 is described in more detail in U.S. Pat. No. 6,788,576 to Roizin et al., which is hereby incorporated by reference.

The present invention will now be described with respect to the single-poly EEPROM cell 100 of FIG. 1. Although the present invention is described with respect to a single-poly EEPROM cell 100, it is understood that the present invention is also applicable to other memory structures which include a floating storage element that would otherwise be subject to exposure to significant UV radiation, e.g., a double-poly memory cell. Moreover, although only one single-poly EEPROM cell 100 is illustrated, one of ordinary skill in the art would understand that a plurality of these memory cells may be configured to form an array.

As described in more detail below, a pre-metal dielectric structure, which includes a light-absorbing structure, is formed over single-poly EEPROM cell 100. This light-absorbing structure blocks UV radiation from reaching substrate 101 during subsequent processing steps (i.e., during formation of a multi-layer interconnect structure) and during operation of EEPROM cell 100. As a result, the UV radiation cannot cause significant electronic charge to be transferred between the floating gate 130 to the control gate 140, or between 140 and n-well 115 and p-well 125).

The fabrication of an overlying multi-layer interconnect structure in accordance with one embodiment of the present invention will now be described.

FIGS. 3A-3E are cross sectional views of EEPROM cell 100 along section line A-A of FIG. 1 during various process steps. The single-poly EEPROM cell 100 as illustrated in FIGS. 1 and 2 is initially fabricated using well known semiconductor processing steps.

Figure 3A:
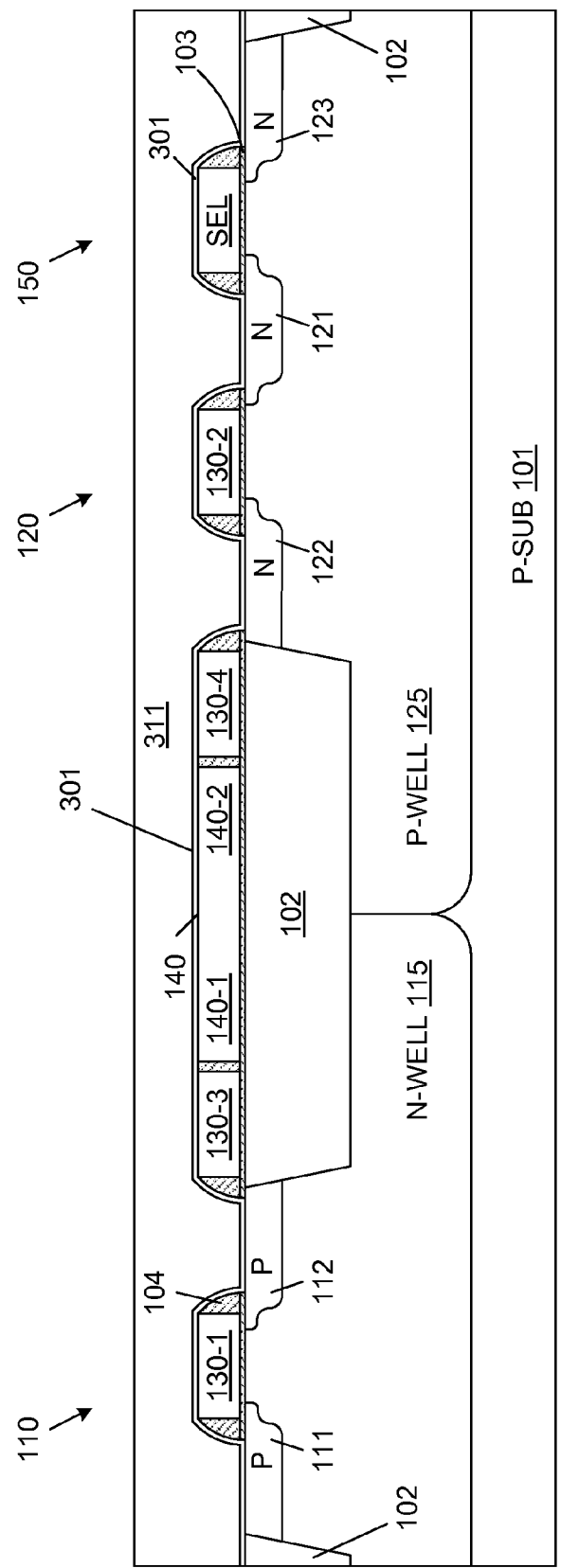
FIGS. 3A, 3B, 3C, 3D and 3E are cross sectional views along section line A-A of FIG. 1 during various process steps in accordance with one embodiment of the present invention.

As shown in FIG. 3A, a thin dielectric barrier layer 301 can be formed over the resulting structure. In the described embodiment, dielectric barrier layer 301 is a silicon nitride layer having a thickness in the range of 100 to 400 Angstroms.

A first pre-metal dielectric layer 311 is then formed over silicon nitride barrier layer 301, as illustrated in FIG. 3A. In the described embodiment, pre-metal dielectric layer 311 is USG or BPSG, deposited to a thickness in the range of 500 to 8000 Angstroms. However, other dielectric materials, having other thicknesses can be used in other embodiments. In accordance with the illustrated embodiment, the upper surface of pre-metal dielectric layer 311 is planarized (e.g., by chemical mechanical polishing (CMP)). However, such planarization is not principal in the discussed embodiments.

Figure 3B:
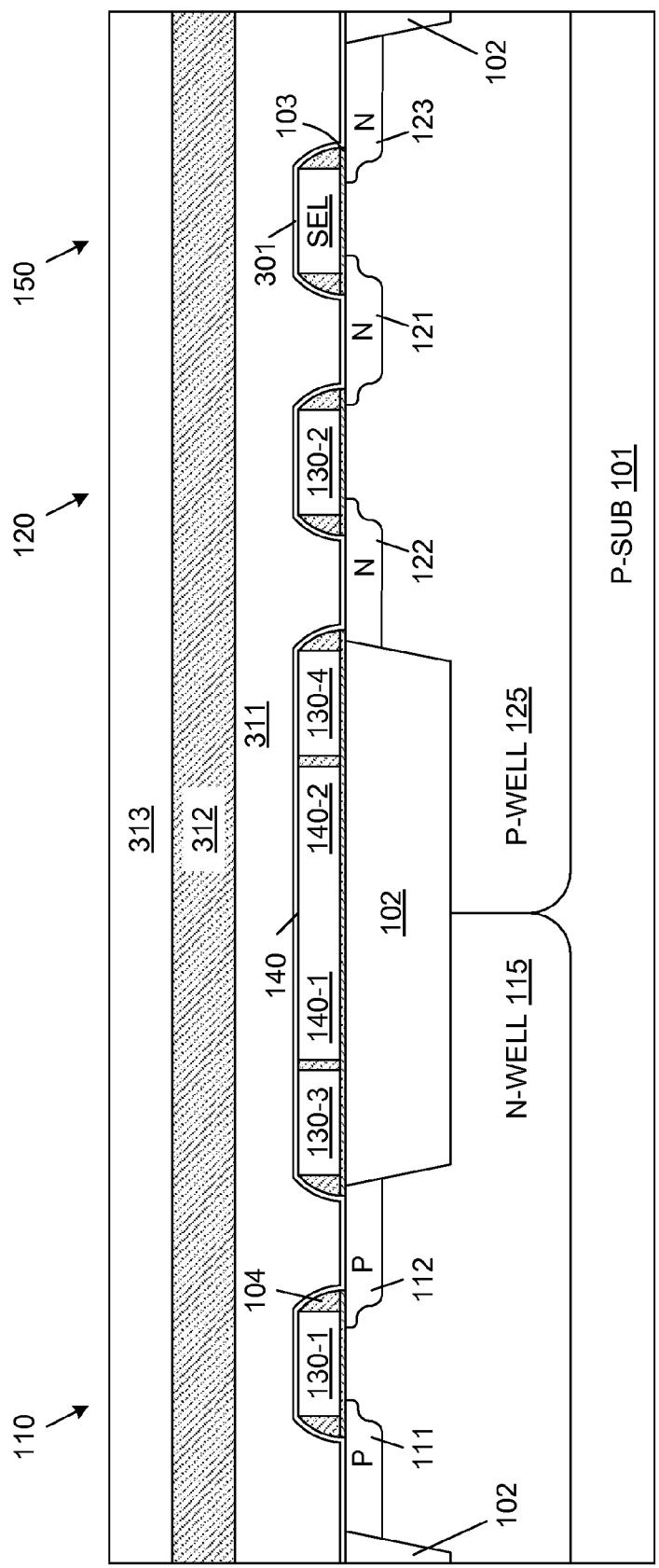

As illustrated in FIG. 3B, a light-absorbing layer 312 is formed over first pre-metal dielectric layer 311. In the described embodiment, light-absorbing layer 312 is a layer of amorphous silicon having a thickness in the range of about 400 to 2000 Angstroms. Other light-absorbing layers can be used in other embodiments. When amorphous silicon layer 312 has a thickness greater than about 1000 Angstroms, this layer will show negligible UV penetration for all practical sources of UV radiation. Advantageously, amorphous silicon is a very high resistance semiconductor. In addition, amorphous silicon is compatible with conventional semiconductor processes and does not introduce significant capacitance to the pre-metal dielectric structure. Advantageously, amorphous silicon is a very high resistance semiconductor.

A second pre-metal dielectric layer 313 is formed over light-absorbing layer 312, as illustrated in FIG. 3B. In the described embodiment, pre-metal dielectric layer 313 can be BPSG deposited to a thickness in the range of 500 to 8000 Angstroms. Other dielectric materials can be used to form second pre-metal dielectric layer 313 in other embodiments. The combined thickness of layers 301 and 311-313 is approximately equal to the thickness of a conventional pre-metal dielectric structure.

Note that in an alternate embodiment, one or more additional dielectric layers (such as silicon oxide) can be fabricated between first pre-metal dielectric layer 311 and amorphous silicon layer 312 to suppress the out-diffusion of impurities from the first pre-metal dielectric layer 311 to amorphous silicon layer 312. Similarly, one or more additional dielectric layers can be fabricated between amorphous silicon layer 312 and second pre-metal dielectric layer 313 to suppress the out-diffusion of impurities from the second pre-metal dielectric layer 313 to amorphous silicon layer 312. Preventing the diffusion of impurities to amorphous silicon layer 312 advantageously minimizes the conductance of this layer 312.

Figure 3C:
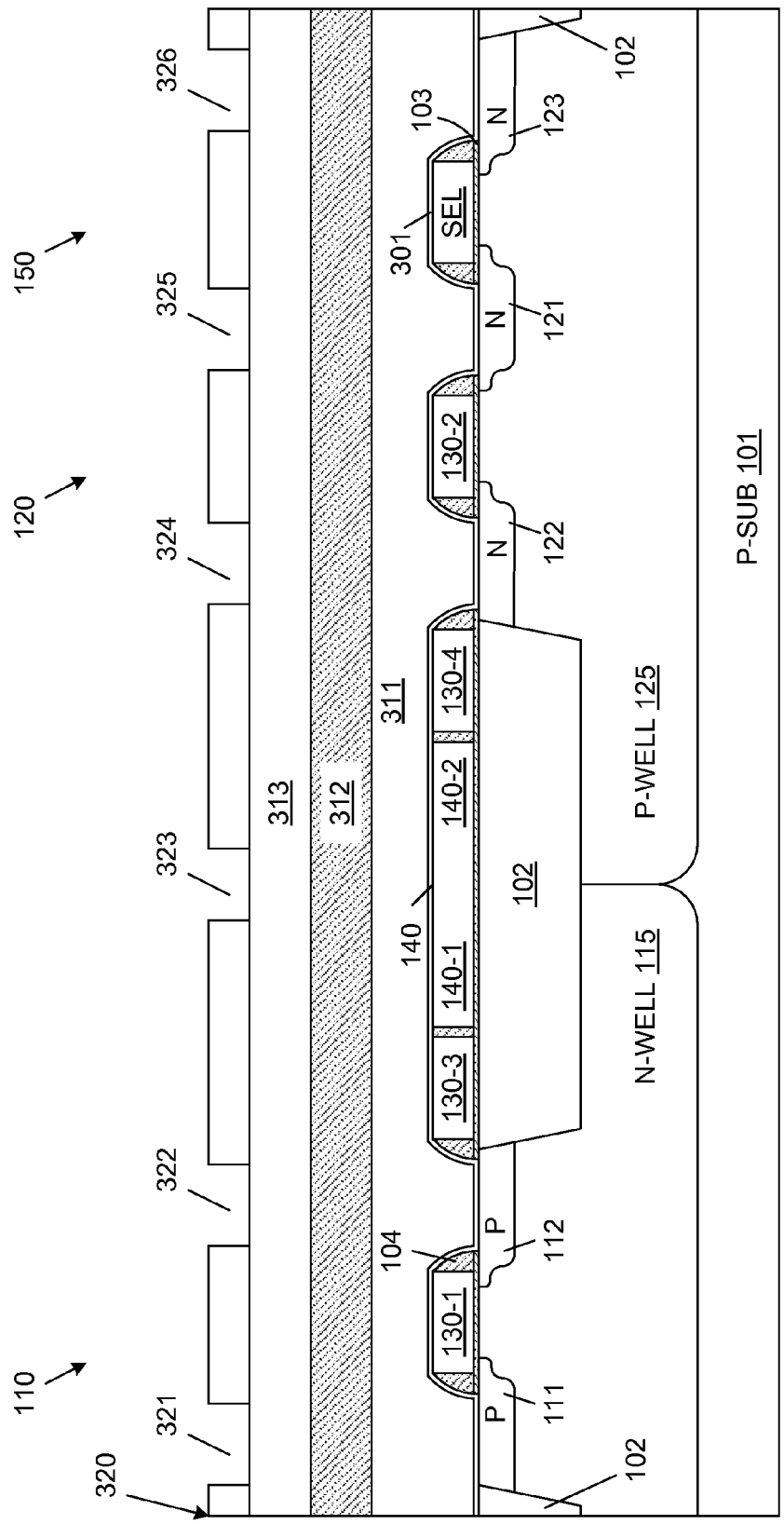
Figure 3D:
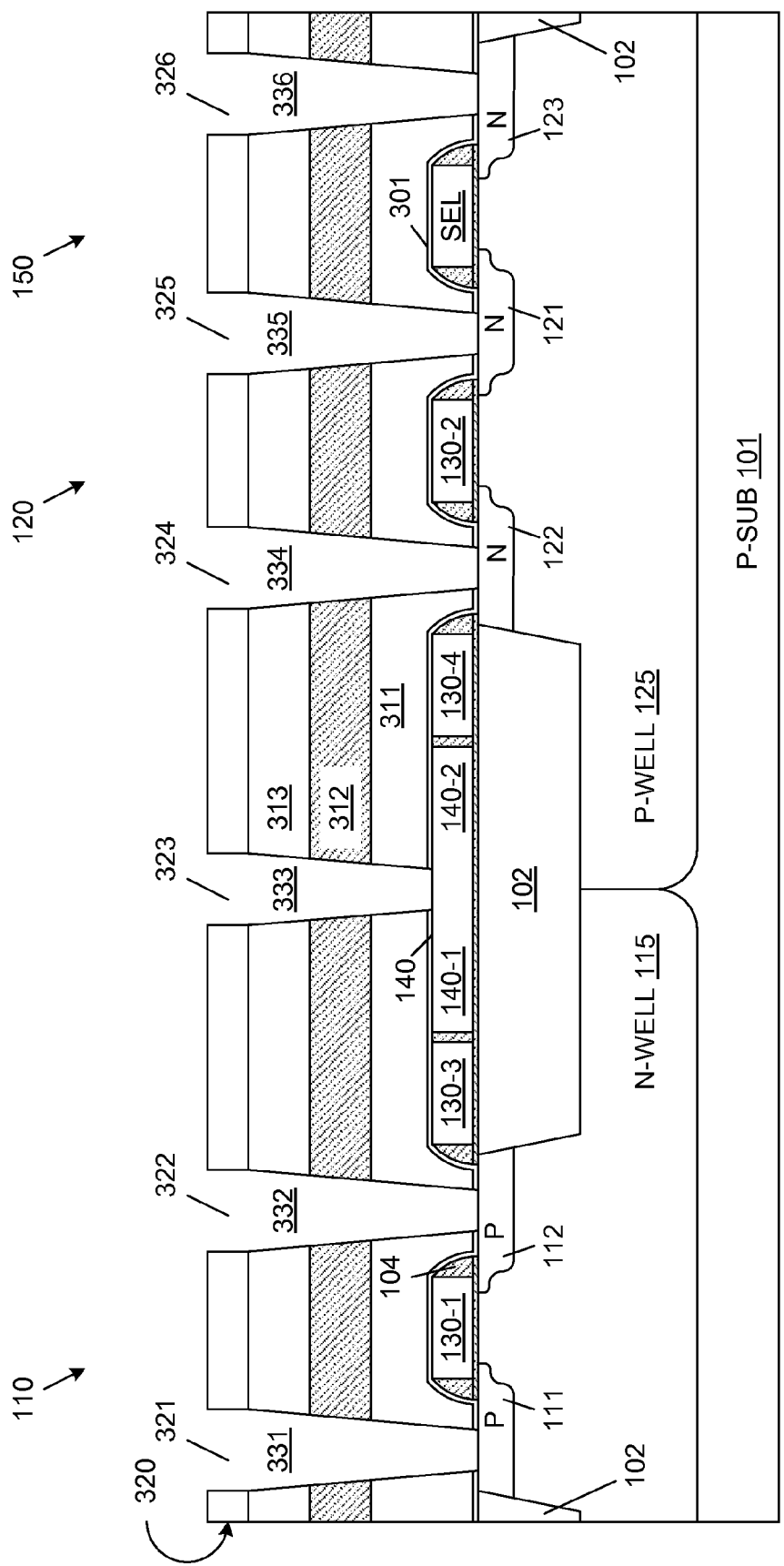

As illustrated in FIG. 3C, a photoresist mask 320 having openings 321-326 is formed over second pre-metal dielectric layer 313. Openings 321-326 define the locations of contacts to be formed to underlying circuit elements. A series of etches is performed through openings 321-326, thereby forming contact openings 331-336, as illustrated in FIG. 3D. Contact openings 331-336 extend through second pre-metal dielectric layer 313, amorphous silicon layer 312 and first pre-metal dielectric layer 311, and stop on silicon nitride layer 301.

Figure 3E:
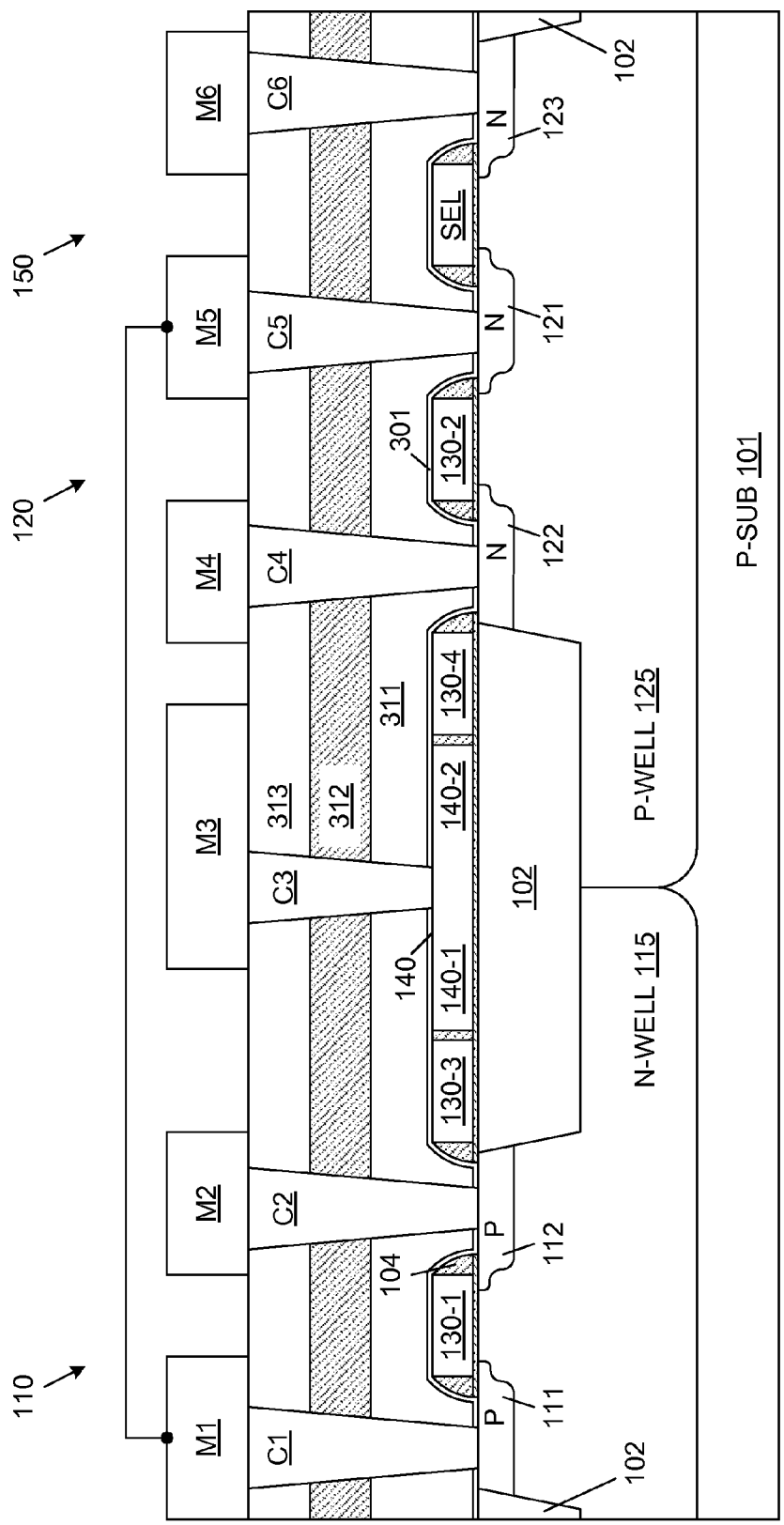

In accordance with one embodiment, etches are performed to remove the exposed portions of silicon nitride layer 301 (and the associated portions of the underlying gate dielectric layer 103) at the bottom of contact openings 331-336. As shown in FIG. 3E, photoresist mask 320 is stripped, and electrically conductive contacts C1-C6 are formed in contact openings 331-336 using conventional process steps. These contacts C1-C6 provide electrical connections to the structures (e.g., N-type regions 121-123, P-type regions 111-112 and control gate 140) exposed by contact openings 331-336. Contacts C1-C6 can be formed, for example, by aluminum or tungsten. A thin barrier/adhesion layer (e.g., Ti/TiN) (not shown) can be deposited in contact openings 331-336 before contacts C1-C6 are formed.

A first metal layer is then deposited over the resulting structure. Another photoresist mask (not shown), which defines the desired pattern of the first metal layer, is formed over the first metal layer. An etch is performed through this photoresist mask, thereby patterning the first metal layer to create the metal traces M1-M6 illustrated in FIG. 3E. Note that metal traces M1 and M5 can be joined outside of the cross section of FIG. 3E. The photoresist mask is then stripped, and the back end processing continues, with the alternating formation of dielectric layers, vias and patterned metal layers.

Note that after amorphous silicon layer 312 is formed, the underlying floating gate 130 is protected from UV radiation present during subsequent processing steps and during normal operation of the resulting single-poly EEPROM cell 100. Consequently, UV radiation does not result in a change in the charge stored by floating gate 130 (e.g., a transfer of electronic charge between floating gate 130 and control gate 140, or between N and P wells 115 and 125). As a result, EEPROM cell 100 is resistant to tamper attacks that rely on UV irradiation.

Figure 3F:
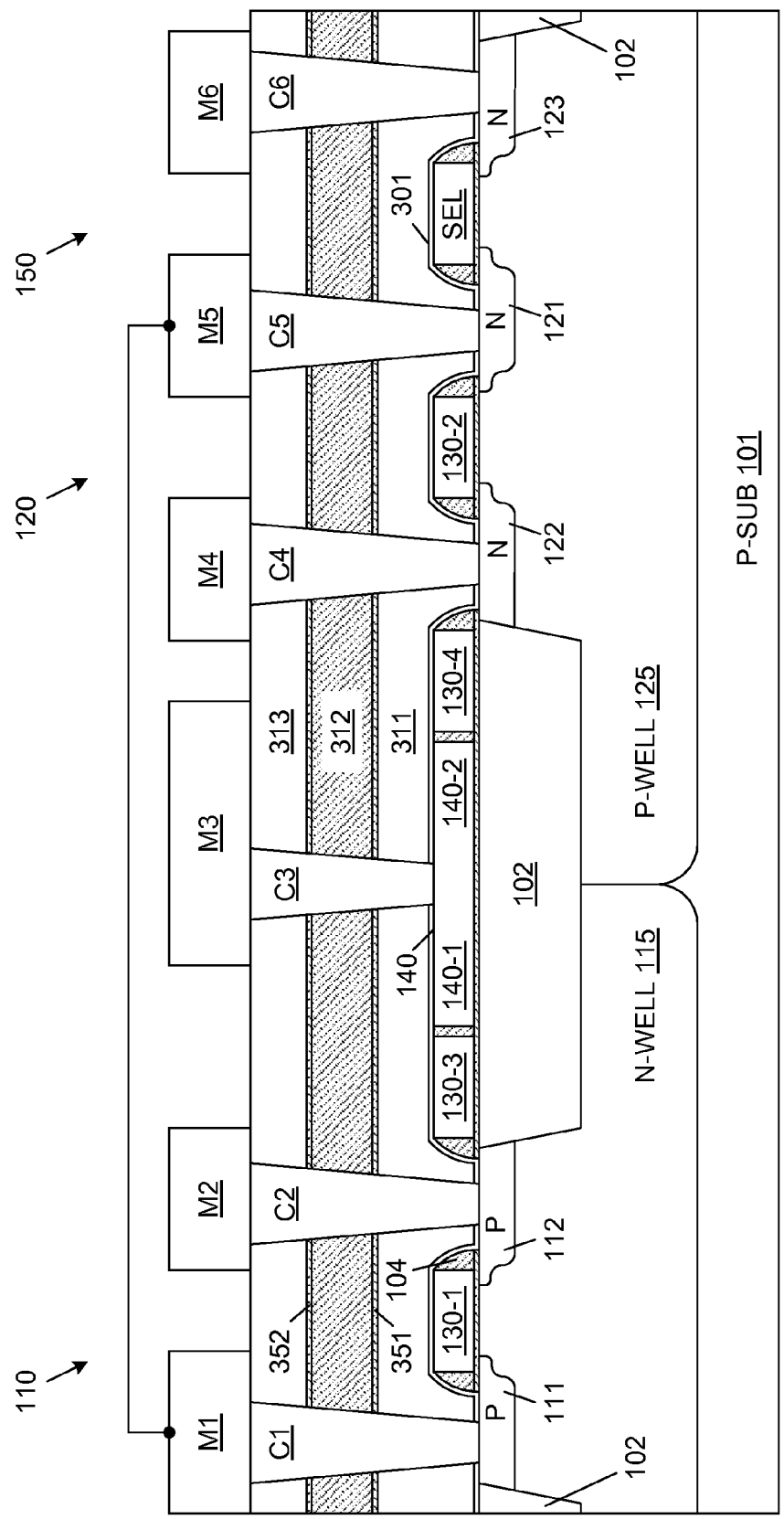
FIG. 3F is a cross sectional view along section line A-A of FIG. 1 for in accordance with an alternate embodiment of the present invention.

It is also important to note that in the described embodiment, the resistance of amorphous silicon layer 312 is high enough to prevent contacts C1-C6 from being electrically shorted through the amorphous silicon layer 312. FIG. 3F is a cross sectional view along section line A-A of FIG. 1 in accordance with an alternate embodiment of the present invention. The embodiment illustrated by FIG. 3F includes diffusion barrier layers 351 and 352, which have been described above in paragraph [0033].

Figure 4A:
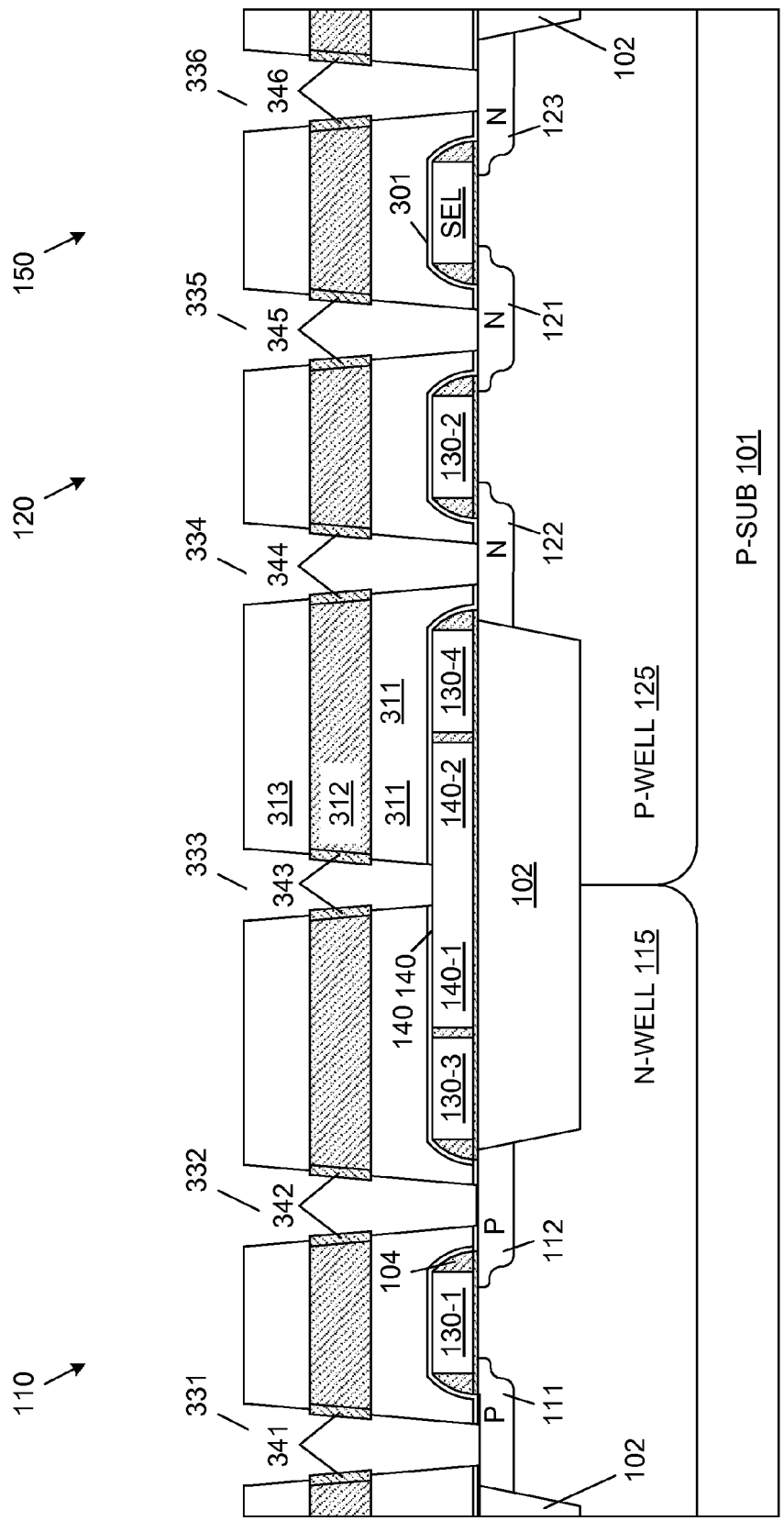
FIGS. 4A and 4B are cross-sectional views along section line A-A of FIG. 1 during various process steps in accordance with one variation of the embodiment of FIGS. 3A-3E.
Figure 4B:
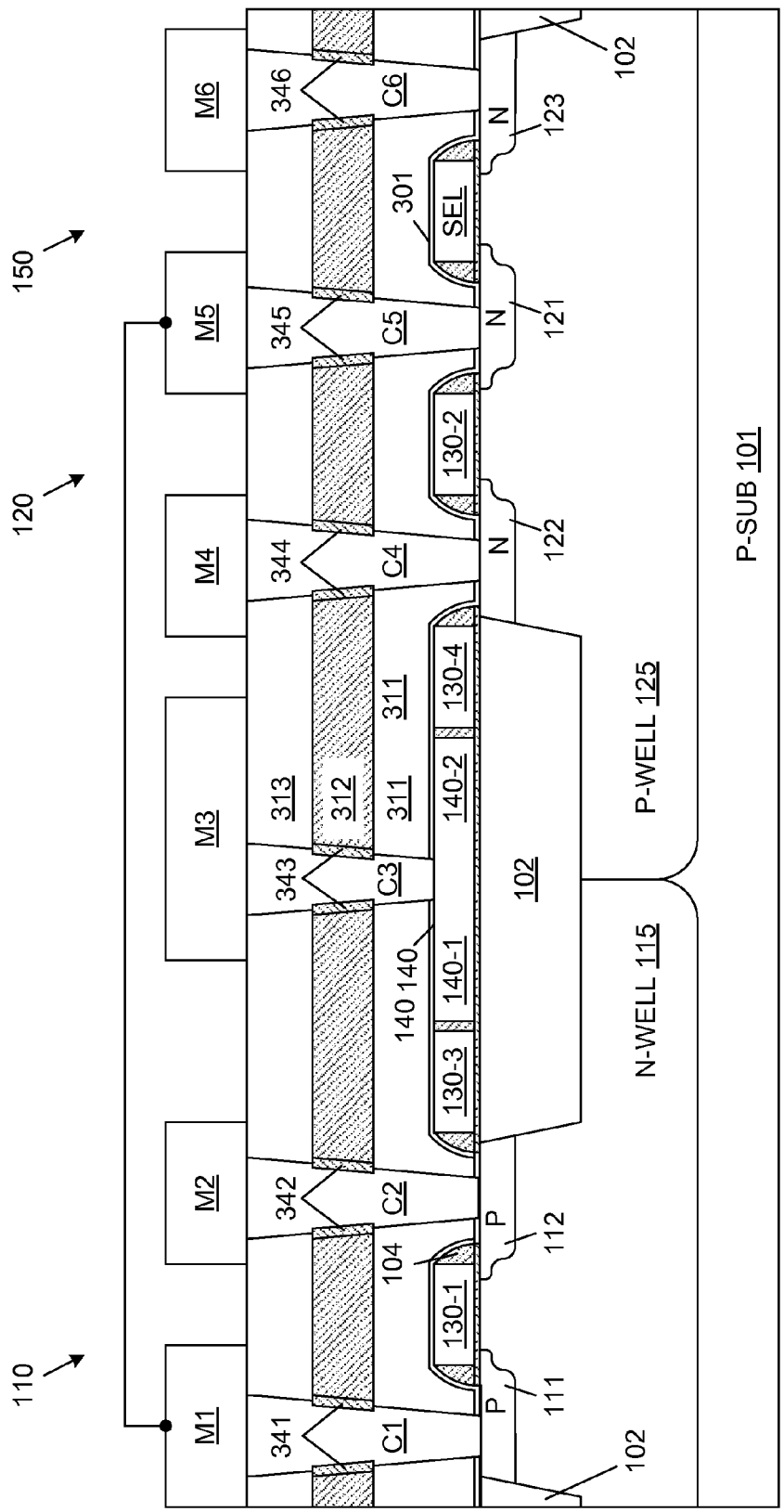

FIGS. 4A and 4B are cross-sectional views of EEPROM cell 100 in accordance with one variation of the above-described embodiment. In accordance with this embodiment processing is performed as described above in connection with FIGS. 3A-3D (and photoresist mask 320 is stripped). An in-situ steam generation (ISSG) oxidation step is then performed, thereby forming silicon oxide regions 341-346 on the exposed sidewalls of amorphous silicon layer 312. The resulting structure is illustrated in FIG. 4A. In the ISSG process, the structure of FIG. 3D is placed in a cold wall chamber with a mixture of hydrogen and oxygen. Wafer is heated by power radiation (RTP), thereby allowing the growth of oxide at the exposed surfaces of the amorphous silicon layer 312 using a very low thermal budget. Note that standard thermal processes would likely result in dopant diffusion and the sealing of contact openings 331-336. After silicon oxide regions 341-346 are formed, processing continues as described above in connection with FIG. 3E, thereby forming contacts C1-C6. Silicon oxide regions 341-346 help ensure that the subsequently formed contacts C1-C6 are not shorted by amorphous silicon layer 312. The resulting structure is shown in FIG. 4B.

Figure 5A:
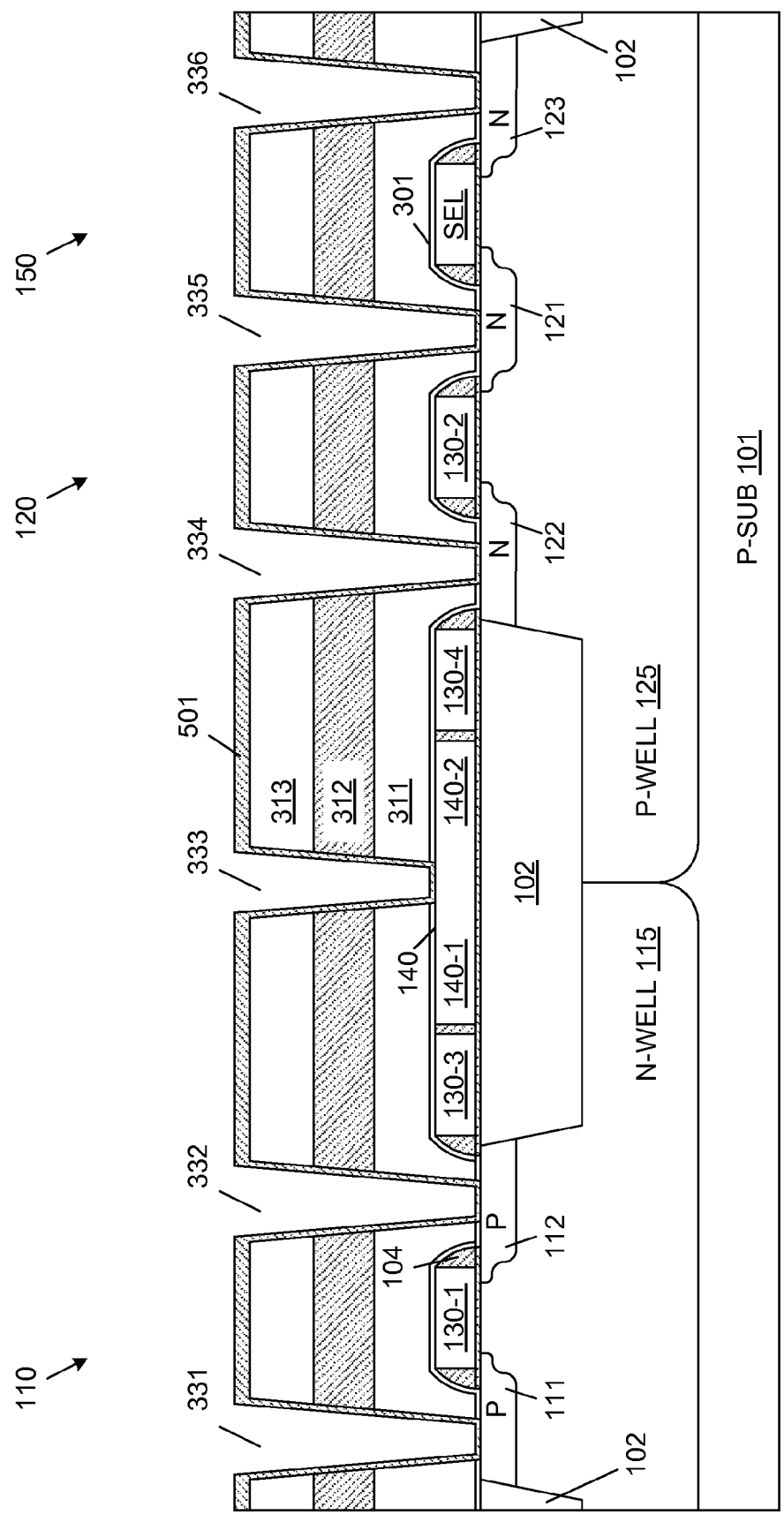
FIGS. 5A, 5B and 5C are cross-sectional views along section line A-A of FIG. 1 during various process steps in accordance with another variation of the embodiment of FIGS. 3A-3E.
Figure 5B:
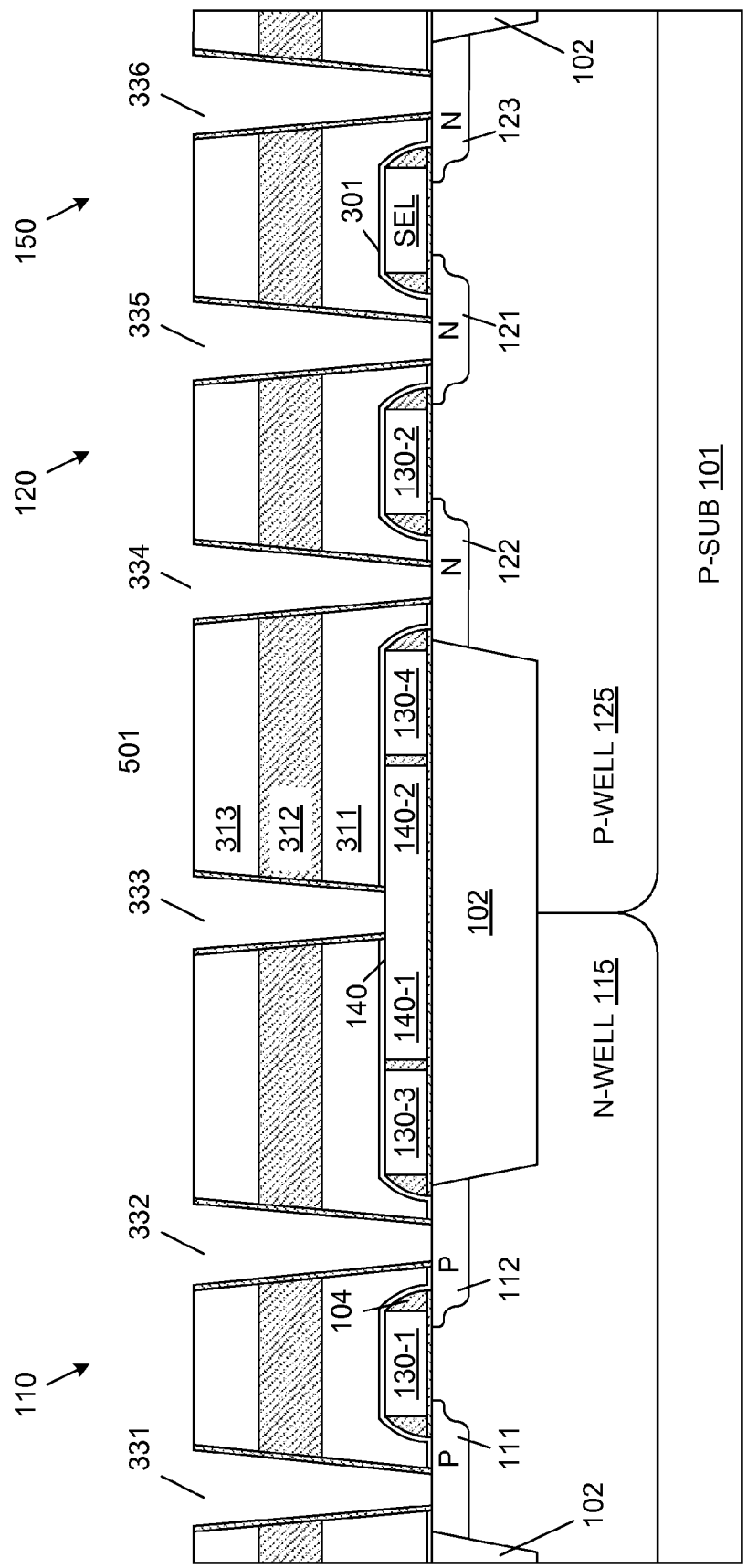
Figure 5C:
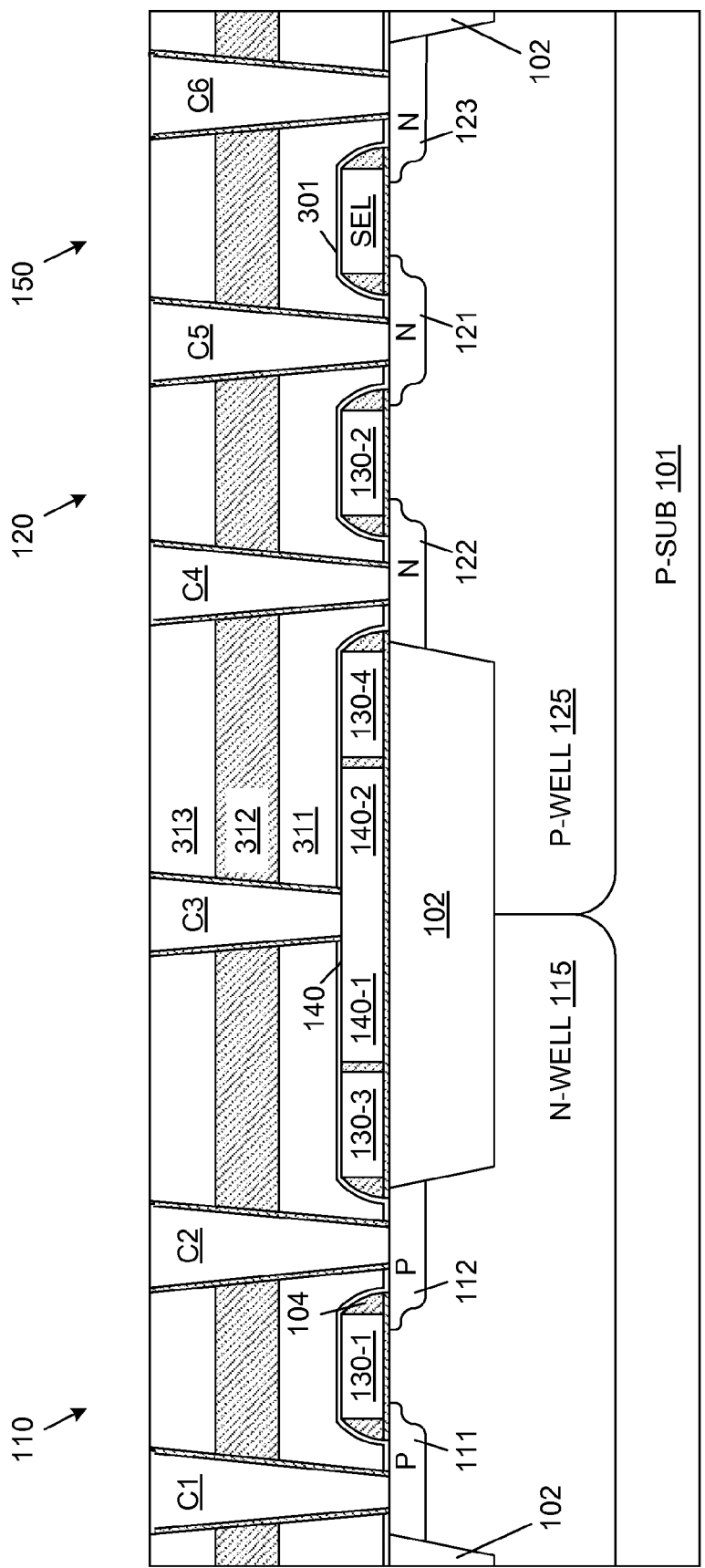

FIGS. 5A, 5B and 5C are cross-sectional views of EEPROM cell 100 in accordance with another variation of the above-described embodiment. In accordance with this variation, processing is performed as described above in connection with FIGS. 3A-3D (photoresist mask 320 is stripped). A chemical vapor deposition (CVD) step is performed, such that a CVD dielectric layer 501 is deposited over the resulting structure (and into contact openings 331-336). In one embodiment, CVD dielectric layer 501 is tetra-ethoxy-silane (TEOS) having a thickness of about 60 to 100 Angstroms on the walls of contact openings 331-336. The resulting structure is shown in FIG. 5A. When depositing the TEOS film 501, the actual thickness on the top of BPSG layer 313 is higher than on the walls of the contact opening.

A directional (vertical) etch is then performed to remove the portions of CVD dielectric layer 501 located on the horizontal surfaces of the resulting structure. The parameters for such a directional etch are known to those of ordinary skill in the art. The resulting structure after the directional etch is complete is shown in FIG. 5B. Processing continues as described above in connection with FIG. 3E, such that contacts C1-C6 are formed. The remaining (un-etched) portions of CVD dielectric layer 501 help ensure that the subsequently formed contacts C1-C6 are not shorted by amorphous silicon layer 312. The resulting structure is shown in FIG. 5C.

Figure 6:
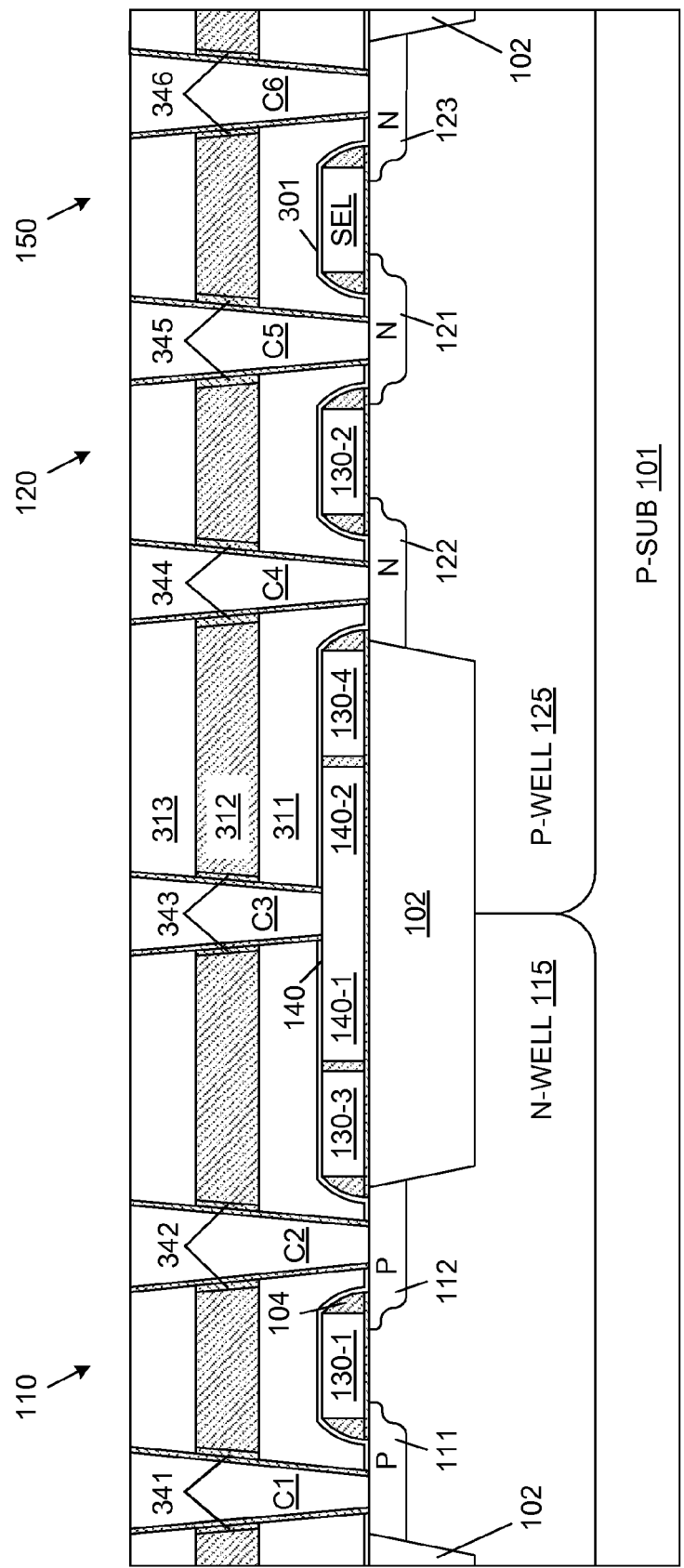
FIG. 6 is a cross-sectional view of a single-poly EEPROM cell formed by combining the variations of FIGS. 4A-4B and 5A-5C.

FIG. 6 is a cross-sectional view of EEPROM cell 100 in accordance with yet another variation of the above-described embodiments. In this variation, both silicon oxide regions 341-346 and CVD dielectric layer 501 are formed prior to forming contacts C1-C6. The presence of both silicon oxide regions 341-346 and CVD dielectric layer 501 further ensure that contacts C1-C6 are not shorted by amorphous silicon layer 312.

In accordance with a second embodiment of the present invention, amorphous silicon layer 312 is patterned before the second pre-metal dielectric layer 313 is formed. This embodiment undesirably requires an additional masking step when compared with the above-described embodiments and variations. In the second embodiment, which is described in more detail below, first pre-metal dielectric layer 311 and amorphous silicon layer 312 are formed as described above in connection with FIGS. 3A and 3B.

Figure 7A:
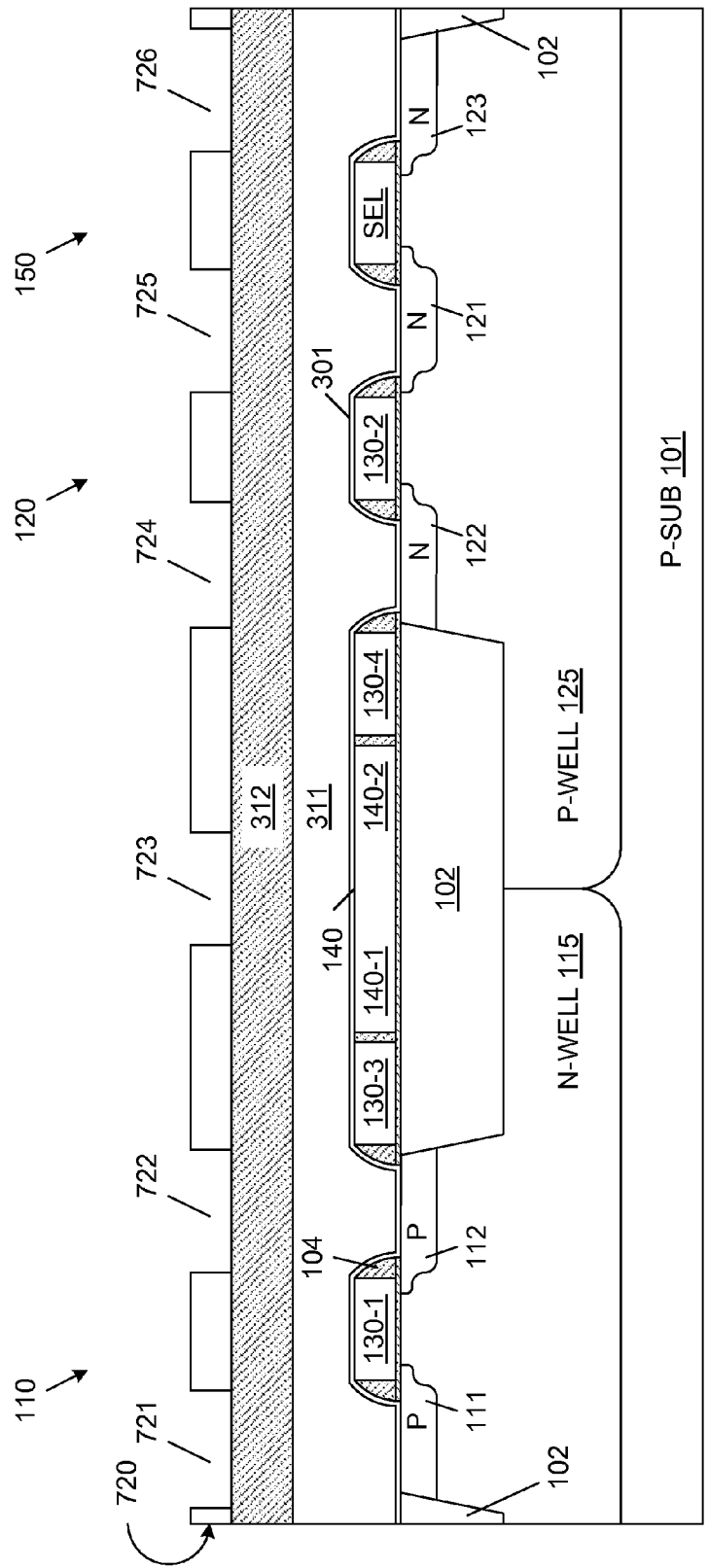
FIGS. 7A, 7B, 7C and 7D are cross-sectional views along section line A-A of FIG. 1 during various process steps in accordance with a second embodiment of the present invention.
Figure 7B:
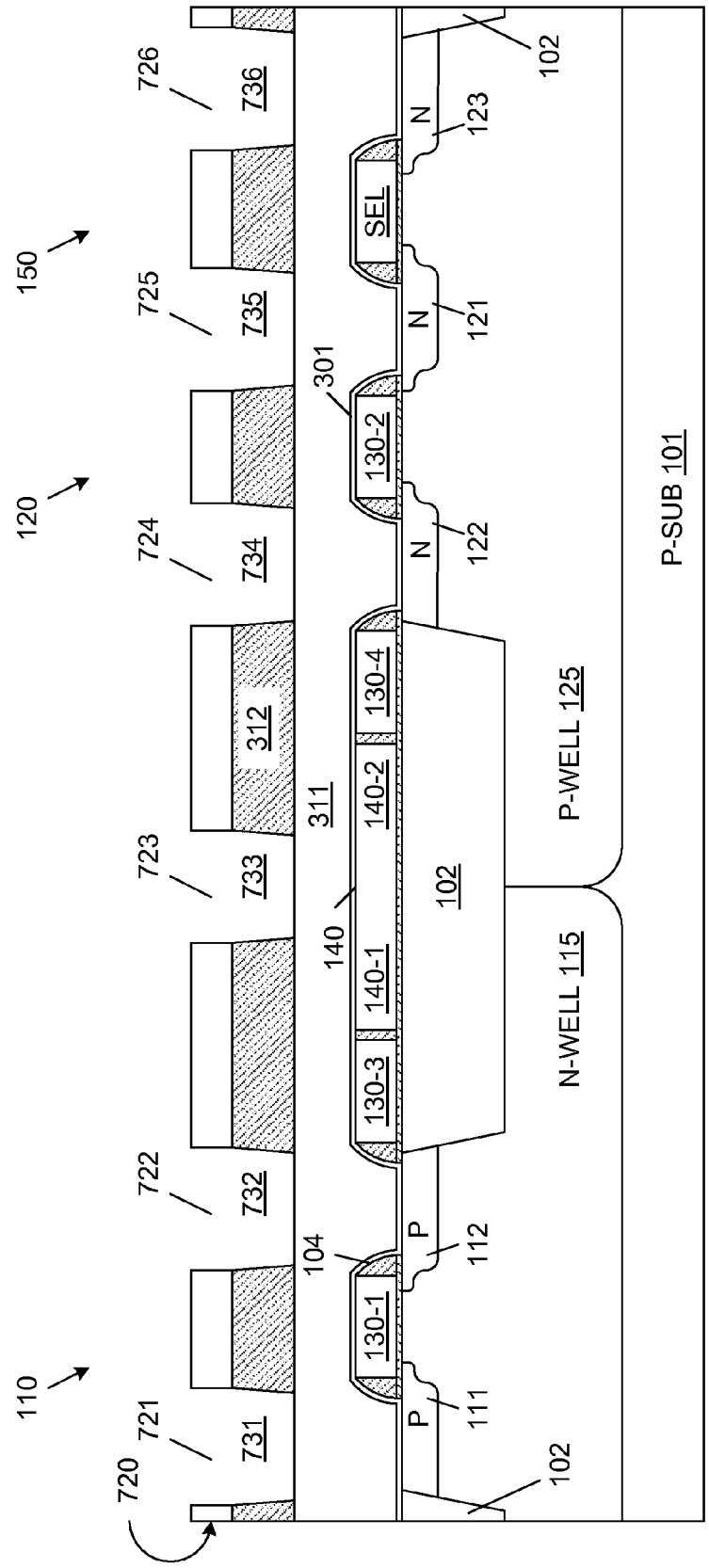

FIGS. 7A, 7B, 7C and 7D are cross-sectional views of single-poly EEPROM cell 100 in accordance with the second embodiment. As illustrated in FIG. 7A, after first pre-metal dielectric layer 311 and amorphous silicon layer 312 have been formed (and before the second pre-metal dielectric layer is formed) a photoresist mask 720 is formed over amorphous silicon layer 312. Photoresist mask 720 includes openings 721-726, which generally define the locations of the contacts to be formed to underlying circuit elements. Openings 721-726 are larger than the openings which are subsequently formed for the contacts. For example, openings 721-726 may have a diameter of about 0.4 microns, while the openings subsequently used to form the contacts may have a diameter of about 0.22 microns. A series of etches is performed through openings 721-726, thereby forming dielectric openings 731-736, as illustrated in FIG. 7B. Dielectric openings 731-736 extend through amorphous silicon layer 312 and stop on first pre-metal dielectric layer 311. Dielectric openings 731-736 may extend into first pre-metal dielectric layer 311, without adverse effects.

Figure 7C:
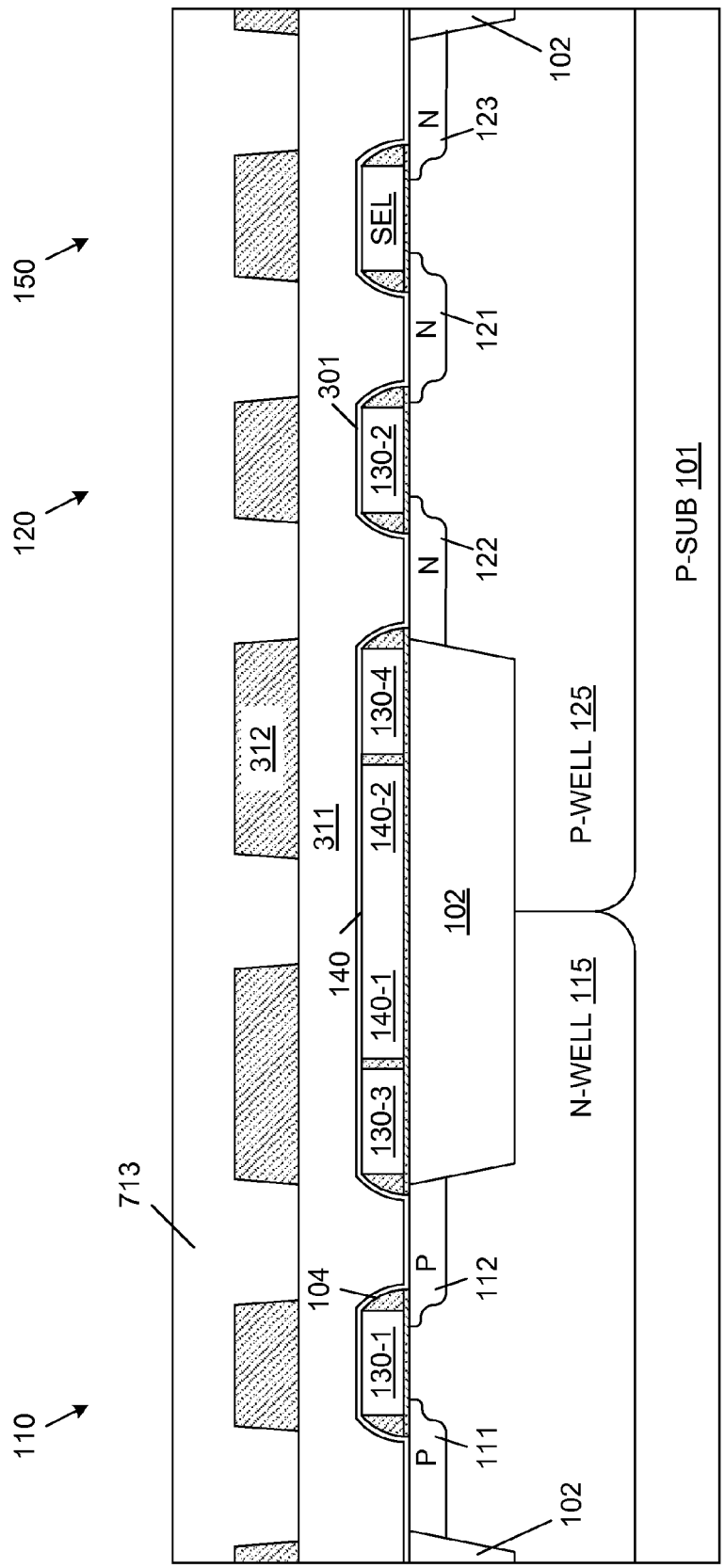

Photoresist mask 720 is stripped, and a second pre-metal dielectric layer 713 is formed over amorphous silicon layer 312, as illustrated in FIG. 7C. The second pre-metal dielectric layer 713 fills dielectric openings 731-736. In the described embodiment, pre-metal dielectric layer 713 can be BPSG deposited to a thickness in the range of 500 to 8000 Angstroms (on the flat external surface). However, other dielectric materials and thicknesses can be used in other embodiments.

Figure 7D:
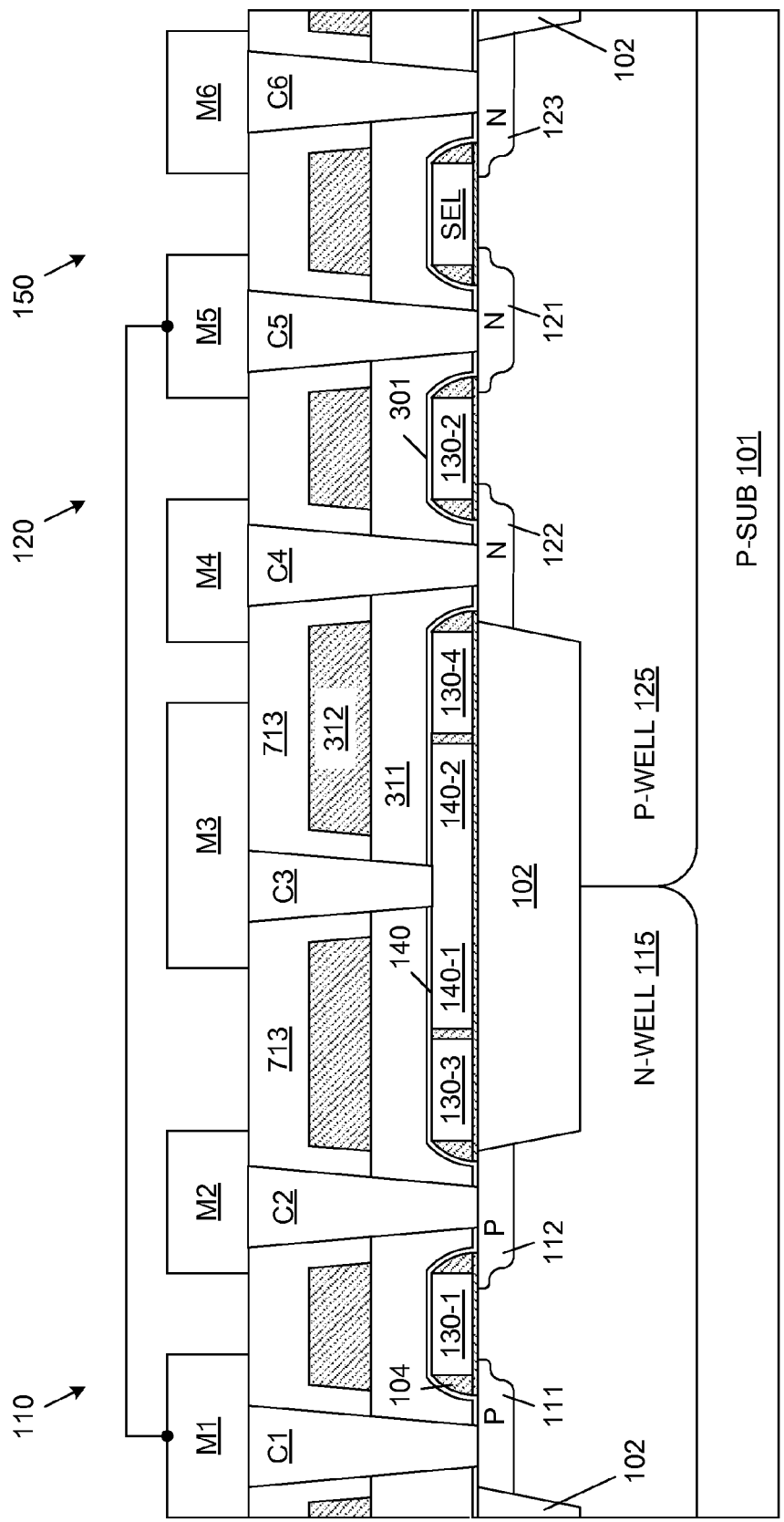

As illustrated in FIG. 7D, contacts C1-C6 are subsequently formed in the manner described above in connection with FIG. 3E. The contact openings 331-336 are formed entirely within dielectric openings 731-736, such that portions of the second pre-metal dielectric layer 713 remain in dielectric openings 731-736, laterally surrounding contacts C1-C6. Contacts C1-C6 therefore do not contact amorphous silicon layer 312. Rather, remaining portions of the second pre-metal dielectric layer 713 in dielectric openings 731-736 serve to isolate contacts C1-C6 from amorphous silicon layer 312.

Figure 8:
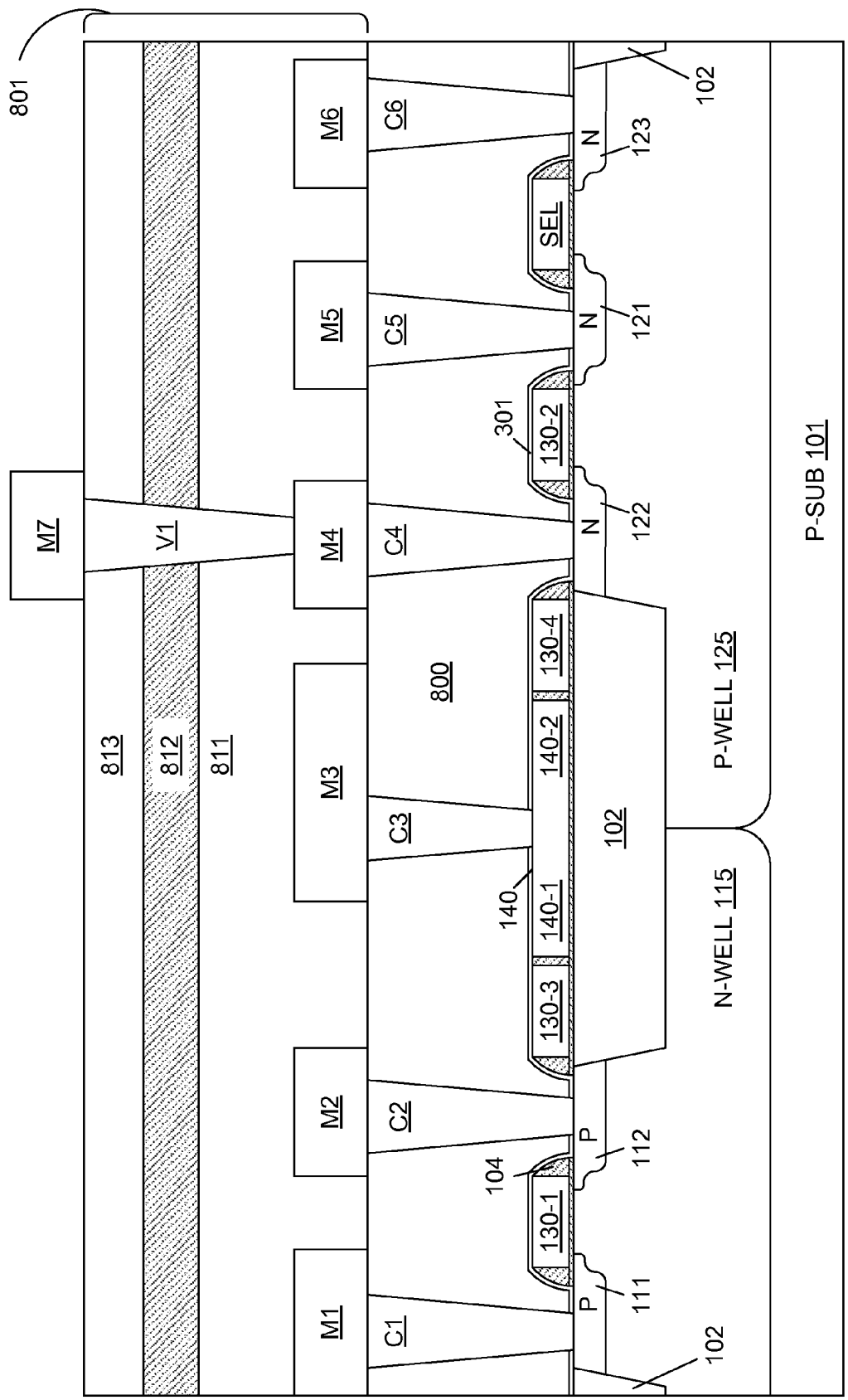
FIG. 8 is a cross sectional view along section line A-A of FIG. 1, in accordance with an embodiment which incorporates the amorphous silicon layer in the first metal dielectric layer.

In the above-described embodiments, amorphous silicon layer 312 has been incorporated in the pre-metal dielectric layer. As a result, amorphous silicon layer 312 is located relatively close to the underlying semiconductor structures. Advantageously, this provides improved UV blocking for the underlying semiconductor structures. In other embodiments, the amorphous silicon layer can be formed in other back end dielectric layers (e.g., the first metal dielectric layer, the second metal dielectric layer, etc.). However, the higher the protecting amorphous silicon layer, the easier it is for a tamperer to remove this layer and form electrical contacts to the chip. FIG. 8 is a cross sectional view along section line A-A of FIG. 1, in accordance with an embodiment which incorporates the amorphous silicon layer in the first metal dielectric layer. The embodiment of FIG. 8 includes a conventional pre-metal dielectric structure 800, and a first metal dielectric structure 801, which includes first dielectric layer 811, amorphous silicon layer 812 and second dielectric layer 813. FIG. 8 also illustrates an electrically conductive via V1 extending through the first metal dielectric structure 801, and a trace M7 of the overlying second metal layer.

Locating amorphous silicon layer 312 in the pre-dielectric layer ensures that attempts to de-process the resulting device by removing the amorphous silicon layer 312 will result in ruining the metal contact pads on top of the multi-layer interconnect structure. As a result, tamperers will be unable to switch the device electrically.

In addition, although the above described embodiments define contact plugs that are made at a different time than the first metal layer, it is understood that the contact plugs and first metal layer may be fabricated at the same time, wherein a portion of the first metal layer fills the contact openings.

Advantageously, the present invention introduces minimal additional process steps over a standard CMOS fabrication process. In addition, the amorphous silicon layer 301 does not add parasitic capacitance typical for conductive metal layer UV protection. Moreover, the amorphous silicon layer 312 exhibits very good compatibility with advanced sub-micron CMOS fabrication processes.

Although the invention has been described in connection with several embodiments, it is understood that this invention is not limited to the embodiments disclosed, but is capable of various modifications, which would be apparent to a person skilled in the art. For example, although the present invention was described in terms of a single amorphous silicon layer 312, it is understood that other numbers of amorphous silicon layers can be used in other embodiments. In addition, the various described p-type regions can be interchanged with the described n-type regions to provide similar results. Though the description was based on single-poly devices, a double-poly floating gate structure can be protected in the same way. Moreover, other UV absorbing materials can be used instead of amorphous silicon, including strongly silicon enriched oxides and nitrides or oxides and nitrides containing silicon clusters. Thus, the invention is limited only by the following claims.

We claim:

1. A method of fabricating a semiconductor device, comprising:
   forming a single conductive gate layer over a surface of a semiconductor region;
   patterning the single conductive gate layer to create a plurality of gate structures, including one or more floating gates, and a control gate adjacent to each of the one or more floating gates;
   forming a first dielectric layer over the gate structures and the semiconductor region;
   forming an amorphous silicon layer over the first dielectric layer; and
   forming a second dielectric layer over the amorphous silicon layer.

2. The method of claim 1, wherein each of the one or more floating gates and the adjacent control gate form a portion of an associated electrically erasable and programmable read only memory (EEPROM) cell.

3. The method of claim 1, wherein the step of forming the single conductive gate layer comprises depositing a layer of polycrystalline silicon.

4. The method of claim 1, further comprising:
   forming a plurality of contact openings through the first dielectric layer, the amorphous silicon layer and the second dielectric layer; and
   forming electrically conductive contacts in the contact openings.

5. The method of claim 4, wherein the step of forming the electrically conductive contacts comprises forming the electrically conductive contacts in contact with the amorphous silicon layer.

6. The method of claim 4, further comprising forming a first dielectric region at locations where the amorphous silicon layer is exposed by the contact openings.

7. The method of claim 6, further comprising forming the first dielectric region by in-situ steam generation (ISSG).

8. The method of claim 6, further comprising forming the first dielectric region by chemical vapor deposition (CVD).

9. The method of claim 8, wherein the first dielectric region comprises tetra-ethoxy-silane (TEOS).

10. The method of claim 6, further comprising forming a second dielectric region over the first dielectric region, wherein the first and second dielectric regions have different compositions.

11. The method of claim 4, further comprising forming a patterned first metal layer over the second dielectric layer and in contact with the electrically conductive contacts.

12. The method of claim 11, wherein the step of forming the electrically conductive contacts comprises contacting the semiconductor region.

13. The method of claim 11, further comprising forming a patterned second metal layer over the patterned first metal layer, wherein the electrically conductive contacts contact the patterned first and second metal layers.

14. The method of claim 1, further comprising forming the first dielectric layer, the amorphous silicon layer and the second dielectric layer such that the amorphous silicon layer is in contact with the first dielectric layer and the second dielectric layer.

15. The method of claim 1, further comprising forming a first diffusion barrier layer between the first dielectric layer and the amorphous silicon layer.

16. The method of claim 15, further comprising forming a second diffusion barrier layer between the second dielectric layer and the amorphous silicon layer.

* * * * *